(12) United States Patent
Wei et al.

(10) Patent No.: US 10,416,507 B2
(45) Date of Patent: Sep. 17, 2019

(54) FABRICATING METHOD OF ARRAY SUBSTRATE, ARRAY SUBSTRATE AND LIQUID CRYSTAL DISPLAY PANEL

(71) Applicant: Shenzhen China Star Optoelectronics Technology Co., Ltd., Shenzhen, Guangdong (CN)

(72) Inventors: Xianwang Wei, Guangdong (CN); Yang Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 16/134,934

(22) Filed: Sep. 18, 2018

(65) Prior Publication Data
US 2019/0018293 A1   Jan. 17, 2019

Related U.S. Application Data

(62) Division of application No. 15/510,231, filed on Mar. 9, 2017, now Pat. No. 10,151,954.

(51) Int. Cl.
*G02F 1/1343* (2006.01)
*G02F 1/1333* (2006.01)
*H01L 27/12* (2006.01)

(52) U.S. Cl.
CPC .. *G02F 1/134363* (2013.01); *G02F 1/133345* (2013.01); *H01L 27/124* (2013.01); *H01L 27/127* (2013.01); *H01L 27/1225* (2013.01); *H01L 27/1259* (2013.01); *G02F 2201/121* (2013.01)

(58) Field of Classification Search
None
See application file for complete search history.

(56) References Cited

U.S. PATENT DOCUMENTS

2018/0217458 A1* 8/2018 Xie ............... G02F 1/1362

* cited by examiner

*Primary Examiner* — Richard H Kim
(74) *Attorney, Agent, or Firm* — Andrew C. Cheng

(57) ABSTRACT

An array substrate includes a substrate and a gate electrode, a gate insulating layer, a channel layer, an insulating layer, and a passivation layer sequentially formed on the surface of the substrate. An oxide semiconductor layer that forms a channel layer and a plurality of first IPS electrodes that are spaced from the oxide semiconductor layer are provided on the gate insulating layer. The insulating layer covers the oxide semiconductor layer and the plurality of first IPS electrodes. The passivation layer covers the channel layer and is formed with trenches. The trenches are located on a side of each of the first IPS electrode and extending to the gate insulation layer. Second IPS electrodes are formed on the passivation layer and corresponding to the first IPS electrodes and are connected to the first IPS electrodes.

4 Claims, 4 Drawing Sheets

FABRICATING METHOD OF ARRAY SUBSTRATE, ARRAY SUBSTRATE AND LIQUID CRYSTAL DISPLAY PANEL

CROSS REFERENCE

This is a divisional application of co-pending U.S. patent application Ser. No. 15/510,231, filed on Mar. 9, 2017, which is a national stage of PCT Application No. PCT/CN2017/071154, filed on Jan. 13, 2017, claiming foreign priority of Chinese Patent Application No. 2016112150263, entitled "Fabricating Method of Array Substrate, Array Substrate and Liquid Crystal Display Panel", filed on Dec. 23, 2016, which is incorporated by reference in its entirety.

FIELD OF THE INVENTION

The present application relates to a liquid crystal display fabricating technology field, and more particularly to an array substrate, fabricating method of the array substrate and a liquid crystal display panel.

BACKGROUND OF THE INVENTION

Thin-Film-Transistor Liquid Crystal Display, TFT-LCD has been widely used because of its advantages of high speed, high brightness and high contrast ratio. The modes of the TFT substrate there are many kinds, the more common are TN, IPS, MVA and so on. The TN mode has the fastest response, but the worst color, viewing angle is relatively smaller, low cost, mainly used in the field of display apparatus and small TV. The TFT substrate with IPS mode is a wide viewing angle display technology, viewing angle is relatively high, fast response, accurate color, the cost is moderate.

However, in the traditional technology, the In-Plane Switching, IPS mode requires higher driving voltage. When the driving voltage is applied to the IPS panel electrode, the liquid crystal molecules closed to the electrode will get more power, but the upper liquid crystal molecules away from the electrode cannot get the same power, and have slower movement, only to increase the driving voltage can make the liquid crystal molecules away from the electrode also get large power, so the drive voltage will be higher. This makes the power consumption in coplanar conversion mode is increased and difficult to match with the TFT. While the molecular electric field driven is weakened to the liquid crystal molecules closed to the substrate, resulting in lower transmittance of light.

SUMMARY OF THE INVENTION

The present application provides an array substrate and a fabricating method thereof, which can improve the driving uniformity of liquid crystal molecules.

An array substrate according to the present application, a method for fabricating the array substrate, wherein the method including forming a gate electrode, a gate insulating layer and an oxide semiconductor layer in sequence on the substrate, wherein the oxide semiconductor layer including a first oxide semiconductor portion opposite to the gate electrode, a second oxide semiconductor portion disposed on both sides of the first oxide semiconductor portion, and a plurality of third oxide semiconductor portions disposed at intervals relative to the second oxide semiconductor portion;

irradiating the oxide semiconductor layer by the ultraviolet light on the surface of the substrate facing away from the gate electrode, and making the second oxide semiconductor portion and the plurality of the third oxide semiconductor portions becomes a second conductor portion and a plurality of third conductor portions, respectively, wherein the plurality of third conductor portions are a first IPS electrode and a common electrode;

forming an insulating layer on the first oxide semiconductor portion, the second conductor portion, the first IPS electrode and the common electrode, and forming a source electrode and a drain electrode on the insulating layer, the source electrode and the drain electrode and channel layer formed by the first oxide semiconductor portion constituting a semiconductor element;

forming a passivation layer on the source electrode, the drain electrode, the channel layer, and the insulating layer, and forming via holes and trenches on the passivation layer and communicating with the first IPS electrode, the trench is on a side of the first IPS electrode and extending to the gate insulating layer; and forming a second IPS electrode corresponding to the first IPS electrode on the passivation layer, and the second IPS electrode is connected to the first IPS electrode by the via hole.

Wherein the step of forming a gate electrode, a gate insulating layer and an oxide semiconductor layer in sequence on the substrate including: forming the oxide semiconductor layer by physically vapor-deposited on the gate insulating layer, and then patterning the oxide semiconductor layer to form the first oxide semiconductor portion, the second oxide semiconductor portions, and the third oxide semiconductor portions.

Wherein the step of forming an insulating layer on the first oxide semiconductor portion, the second conductor portion, the first IPS electrode and the common electrode, and forming a source electrode and a drain electrode on the insulating layer including: forming a through hole on the insulating layer and in communication with the first oxide semiconductor portion, and then depositing a metal layer on the insulating layer, and the metal layer is patterned to form the source electrode and the drain electrode to form the channel layer.

Wherein the step of forming a second IPS electrode corresponding to the first IPS electrode on the passivation layer, and the second IPS electrode is connected to the first IPS electrode by the via hole including: forming an ITO layer on the passivation layer, patterning the ITO layer to form the second IPS electrode, and the second IPS electrode fills the via hole to connect to the first IPS electrode.

Wherein the source electrode and the drain electrode are connected to the second conductor portion on both sides of the first oxide semiconductor portion by the through holes provided in the insulating layer, respectively.

The array substrate of the present application including a substrate, a gate electrode, a gate insulating layer, a channel layer, an insulating layer, and a passivation layer sequentially formed on the surface of the substrate;

an oxide semiconductor layer constituting the channel layer and a plurality of first IPS electrodes spaced apart from the oxide semiconductor layer is further provided on the gate insulating layer;

the insulating layer covers the oxide semiconductor layer and the oxide semiconductor layer and the plurality of first IPS electrodes; the passivation layer covers the channel layer and formed with trenches, the trenches located on a side of each of the first IPS electrode and extending to the gate insulation layer;

a plurality of second IPS electrodes corresponding to the first IPS electrodes are formed on the passivation layer, and the second IPS electrodes are connected to the first IPS electrodes.

Wherein the second IPS electrodes are connected to the first IPS electrode by via hole.

Wherein the plurality of the second IPS electrodes including a first set first set of electrodes and a second set of electrodes arranged in interval, and each second IPS electrodes in the first set of electrodes is disposed between two of the second IPS electrodes in the second set of electrodes.

The liquid crystal display panel of the present application including a color filter substrate, an array substrate, and a space for disposing the liquid crystal formed between the color filter substrate and the array substrate, the array substrate including a substrate, a gate electrode, a gate insulating layer, a channel layer, an insulating layer, and a passivation layer sequentially formed on the surface of the substrate; an oxide semiconductor layer constituting the channel layer and a plurality of first IPS electrodes spaced apart from the oxide semiconductor layer is further provided on the gate insulating layer; the insulating layer covers the oxide semiconductor layer and the oxide semiconductor layer and the plurality of first IPS electrodes; the passivation layer covers the channel layer and formed with trenches, the trenches located on a side of each of the first IPS electrode and extending to the gate insulation layer; a plurality of second IPS electrodes corresponding to the first IPS electrodes are formed on the passivation layer, and the second IPS electrodes are connected to the first IPS electrodes; the trenches of the array substrate is connected to the space, and the liquid crystal is distributed in the liquid crystal space and the trenches.

The array substrate of the liquid crystal display panel of the present application has the first IPS electrode and the second IPS electrode, when the liquid crystal is driven by power, the voltage of the two electrodes is uniform to form the double IPS driving structure array substrate, and the liquid crystal in the bottom groove of the trench can be driven by a sufficient voltage to ensure effective driving of the liquid crystal layer and to achieve a high transmittance of the liquid crystal.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the application. Embodiments and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 1:
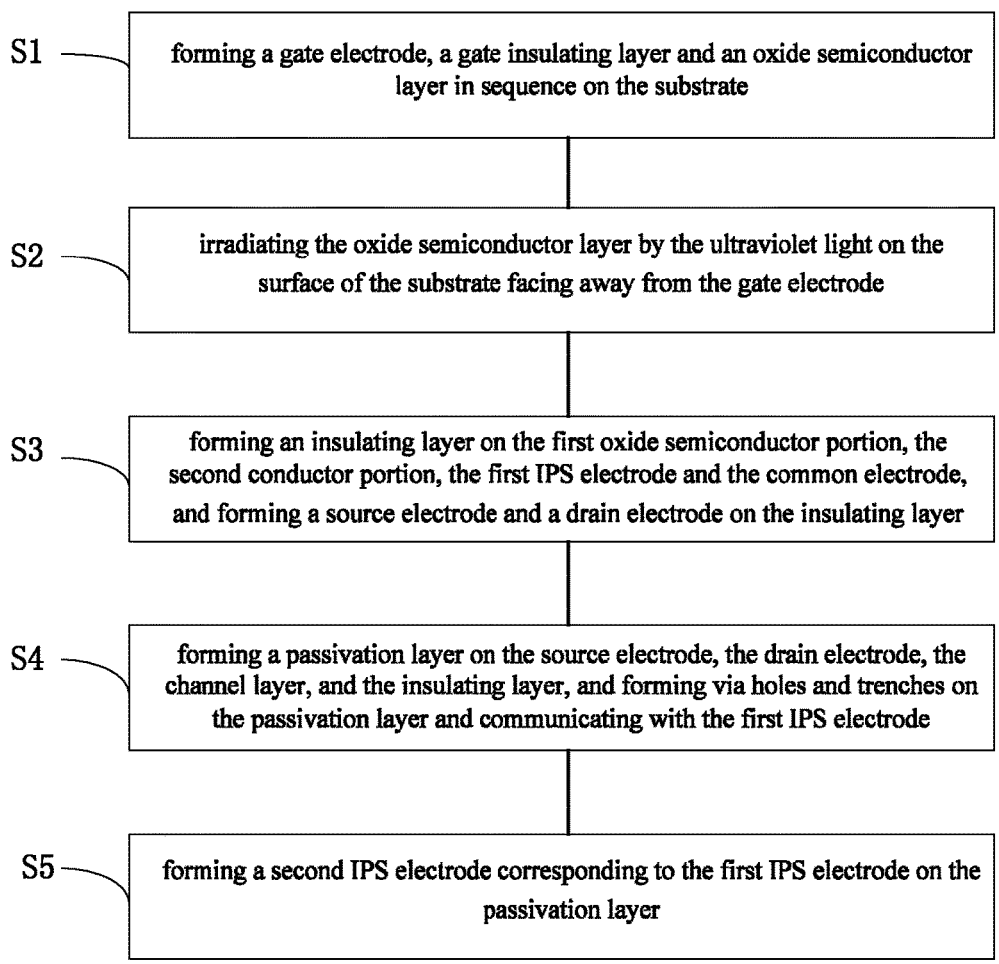
FIG. 1 is a flow chart illustrates a fabricating method of an array substrate according to the present application.
Figure 2:
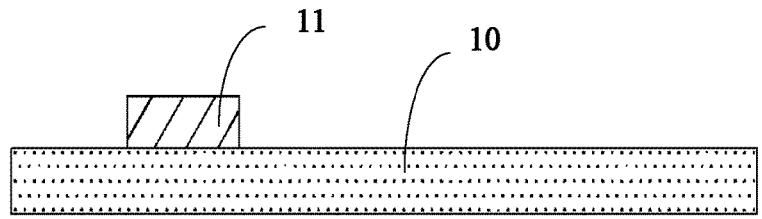
FIGS. 2 to 6 are schematic views showing each of the steps of the method for fabricating the array substrate illustrated in FIG. 1.
Figure 3:
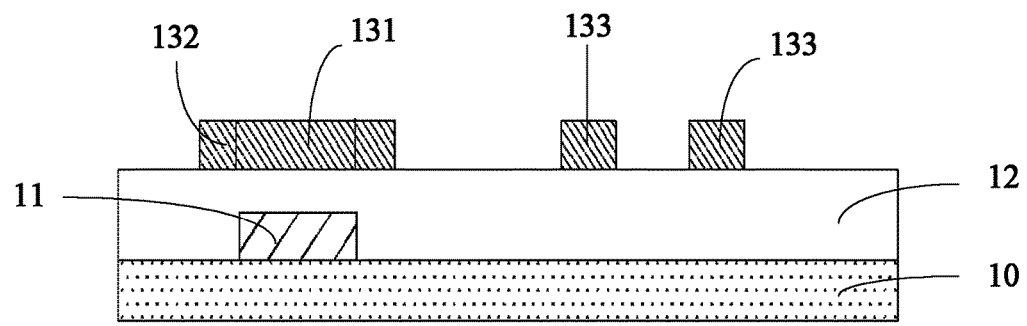

Referring to FIGS. 1, 2 and 3, the present application provides a method for fabricating an array substrate, which includes the following steps:

Step S1, the gate electrode 11, the gate insulating layer 12 and the oxide semiconductor layer are formed in sequence on the substrate 10, wherein the oxide semiconductor layer includes a first oxide semiconductor portion 131 opposite to the gate electrode 11, a second oxide semiconductor portion 132 disposed on both sides of the first oxide semiconductor portion 131, and a plurality of third oxide semiconductor portions 133 disposed at intervals relative to the second oxide semiconductor portion 132.

In this step includes forming the oxide semiconductor layer by physically vapor-deposited on the gate insulating layer 12, and then patterning the oxide semiconductor layer to form the first oxide semiconductor portion 131, the second oxide semiconductor portions 132, and the third oxide semiconductor portions.

Figure 4:
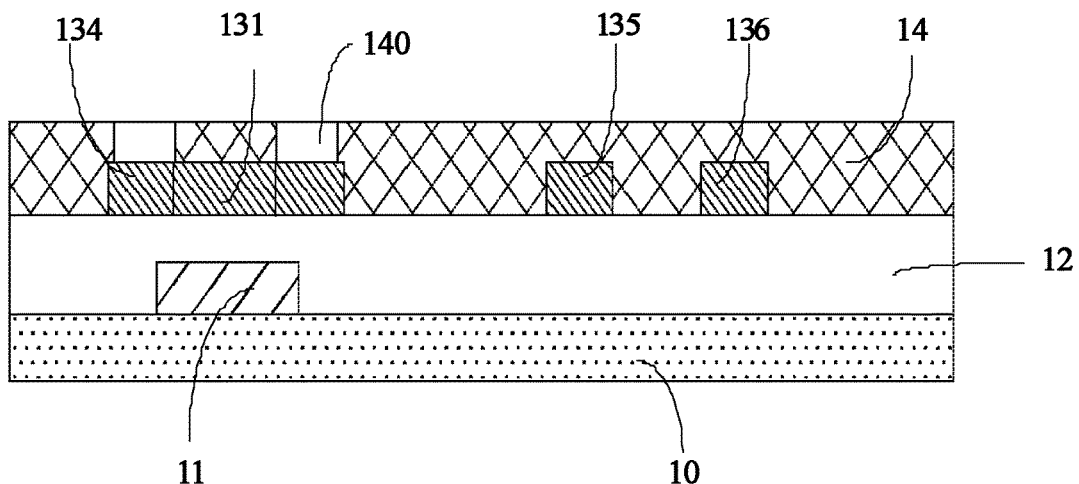

Combined and referring to FIG. 4, in step S2, irradiating the oxide semiconductor layer by the ultraviolet light on the surface of the substrate 10 facing away from the gate electrode 11, and making the second oxide semiconductor portion 132 and the plurality of the third oxide semiconductor portions 133 becomes a second conductor portion 134 and a plurality of third conductor portions, respectively, wherein the plurality of third conductor portions are divided into a first IPS electrode 135 and a common electrode 136. In this step, the ultraviolet light is irradiated to the oxide semiconductor layer, the first oxide semiconductor portion 131 is shielded by the gate electrode 11, and the other portion is turned into conductors by the irradiation of the ultraviolet light. Both the first IPS electrode 135 and the common electrodes 136 are multiple and arranged in cross and insulated.

Figure 5:
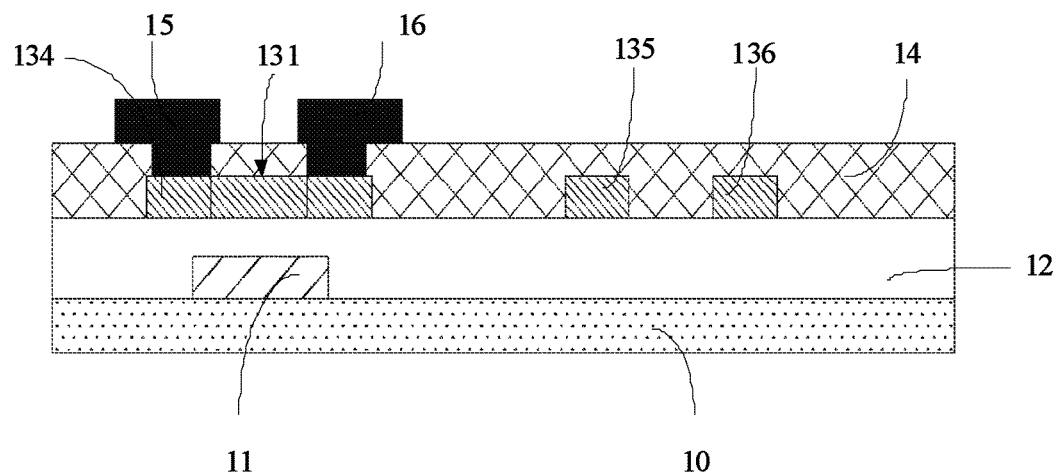

Combined and referring to FIG. 5, in step S3, an insulating layer 14 is formed on the first oxide semiconductor portion 131, the second conductor portion 134, the plurality of first IPS electrodes 135 and the common electrode 136, and a source electrode 15 and a drain electrode 16 are formed on the insulating layer 14, the source electrode 15 and the drain electrode 16 and the first oxide semiconductor portion 131 are formed a channel layer. Wherein the source electrode 15 and the drain electrode 16 are connected to the second conductor portion 134 on both sides of the first oxide semiconductor portion 131 by through holes provided in the insulating layer 14, respectively.

In this step, the through hole is formed in the insulating layer 14 and in communication with the first oxide semiconductor portion 131, and then a metal layer is deposited on the insulating layer 14, and the metal layer is patterned to form the source electrode 15 and the drain electrode 16, respectively.

Figure 6:
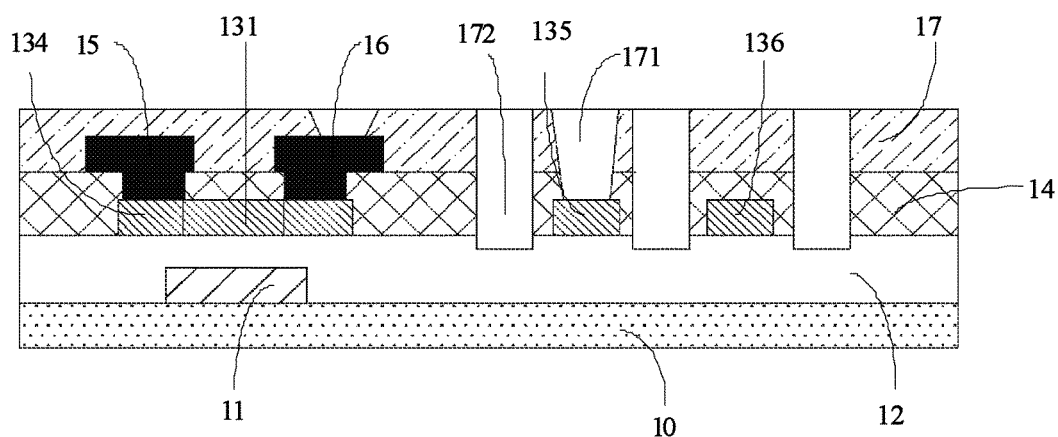

Referring to FIG. 6, in step S4, forming a passivation layer 17 on the source electrode 15, the drain electrode 16, the channel layer, and the insulating layer 14, and forming via holes 171 and trenches 172 on the passivation layer 17, wherein the trenches 172 are on the side of each of the first IPS electrodes 135 and extending to the gate insulating layer 12, the via holes 171 are communicating with the first IPS electrode 135. The bottom groove of the trench 172 is recessed on the gate insulating layer 12 on the side of the first IPS electrode 135.

Figure 7:
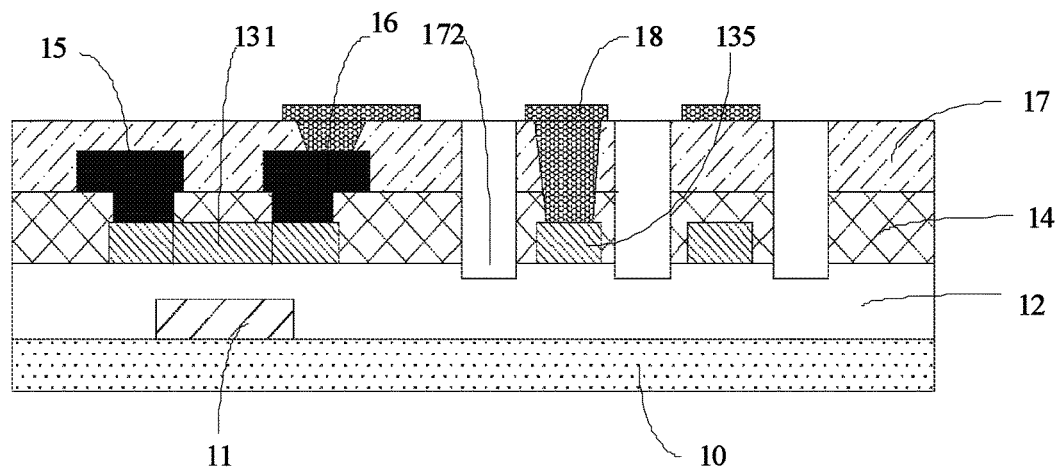
FIG. 7 is a schematic view of the array substrate of the present application.

Referring to FIG. 7, in step 5, forming a second IPS electrode 18 corresponding to the first IPS electrode 135 on the passivation layer 17, and the second IPS electrode 18 is connected to the first IPS electrode 135. Specifically, an ITO layer is formed on the passivation layer, the ITO layer is patterned to form the second IPS electrode 18, and the second IPS electrode fills the via hole to connect to the first IPS electrode. The array substrate formed by the fabricating method includes the first IPS electrode and the second IPS electrode in the upper and lower layers, the liquid crystal is filled in the bottom groove, the voltage is applied to drive the liquid crystal, the voltage of the two electrodes is uniform, the liquid crystal located in the bottom groove can be driven by sufficient voltage as well, and thus ensure the effective driving of the liquid crystal layer.

Figure 8:
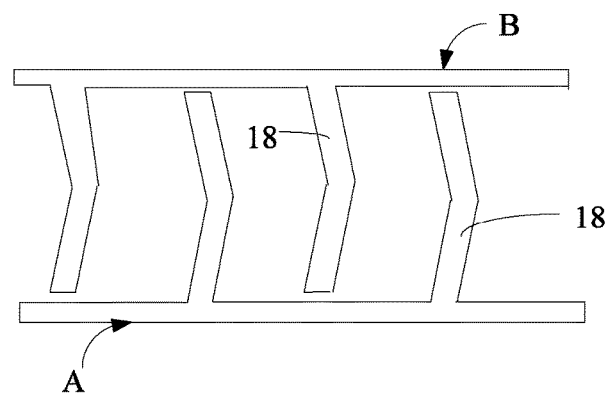
FIG. 8 is a schematic view of the arrangement of the first set of electrodes and the second set of electrodes in the fabricating method of the array substrate illustrated in FIG. 1.

As illustrated in FIG. 8, it should be noted that the plurality of the second IPS electrodes 18 include a first set of electrodes A and a second set of electrodes B arranged in a column, and each second IPS electrodes in the first set of electrodes A is disposed between two of the second IPS electrodes in the second set of electrodes B. It can be understood that the plurality of the second IPS electrodes 18 are arranged in a plurality of columns and is connected to the first IPS electrode to a side having the via hole, while the second IPS electrode in the first set of electrodes A and the second IPS electrode in the second set of electrodes B are arranged in cross and insulated. Thus the position of disposing the via holes can be staggered, and the plurality of via holes 171 in the same straight line are prevented from affecting the substrate strength.

As shown in FIG. 7, the present application also provides an array substrate fabricated by the above mentioned fabricating method, the array substrate includes a substrate 10, a gate electrode 11, a gate insulating layer 12, a channel layer 19, an insulating layer 14, and a passivation layer 17 sequentially form the surface of the substrate. An oxide semiconductor layer constituting the channel layer and a plurality of first IPS electrodes 135 spaced apart from the oxide semiconductor layer is further provided on the gate insulating layer 12; the insulating layer 14 covers the oxide semiconductor layer and the oxide semiconductor layer and the plurality of first IPS electrodes 135, the passivation layer 17 covers the channel layer and formed with trenches 172, the trenches located on a side of each of the first IPS electrode 135 and extending to the gate insulation layer 12; A plurality of second IPS electrodes 18 corresponding to the first IPS electrodes 135 are formed on the passivation layer 17, and the second IPS electrodes 18 are connected to the first IPS electrodes 18 by via holes.

The method for fabricating the array substrate according to the present application does not need to add complicated steps, only needs the ultraviolet ray illumination from backside to conduct the semiconductor, and can realize the double electrode effect of the array substrate. The array substrate includes the first IPS electrodes conducted by the oxide semiconductor layer and the second IPS electrode fabricated by ITO and connecting the first IPS electrode and the second IPS electrode through the via hole to ensure that the voltage of the two electrodes is uniform and to form the array substrate of the double IPS driving structure to effectively reduce the driving voltage of the liquid crystal. The common electrode 136 is also cross disposed with the first IPS electrode 135 on the gate insulating layer 12.

The present application also provides a liquid crystal display panel (not shown) including a color filter substrate, the array substrate, and a space for disposing the liquid crystal is formed between the color filter substrate and the array substrate, the trenches of the array substrate is connected to the space, the liquid crystal is distributed in the liquid crystal space and the trenches.

The array substrate of the liquid crystal display panel of the present application has the first IPS electrode and the second IPS electrode. When the liquid crystal is driven by power, the voltage of the two electrodes is uniform to form the double IPS driving structure array substrate, and the liquid crystal in the bottom groove of the trench can be driven by a sufficient voltage to ensure effective driving of the liquid crystal layer and to achieve a high transmittance of the liquid crystal.

Above are embodiments of the present application, which does not limit the scope of the present application. Any modifications, equivalent replacements or improvements within the spirit and principles of the embodiment described above should be covered by the protected scope of the invention.

What is claimed is:

1. An array substrate, comprising:
   a substrate; and
   a gate electrode, a gate insulating layer, a channel layer, an insulating layer, and a passivation layer sequentially formed on a surface of the substrate;
   wherein an oxide semiconductor layer that forms a channel layer and a plurality of first in-plane switching (IPS) electrodes that are spaced apart from the oxide semiconductor layer are provided on the gate insulating layer;
   wherein the insulating layer covers the oxide semiconductor layer and the plurality of first IPS electrodes;
   wherein the passivation layer covers the channel layer and is formed with trenches, the trenches located on a side of each of the first IPS electrode and extending to the gate insulation layer; and
   a plurality of second IPS electrodes are formed on the passivation layer and corresponding to the first IPS electrodes, the second IPS electrodes being connected to the first IPS electrodes.

2. The array substrate according to claim 1, wherein the second IPS electrodes are connected to the first IPS electrode by a via.

3. The array substrate according to claim 1, wherein the plurality of second IPS electrodes comprise a first set of electrodes and a second set of electrodes arranged at interval, and each of the second IPS electrodes in the first set of electrodes is disposed between two of the second IPS electrodes in the second set of electrodes.

4. A liquid crystal display panel, comprising a color filter substrate, an array substrate, and a space for disposing the liquid crystal formed between the color filter substrate and the array substrate, the array substrate comprising a substrate and a gate electrode, a gate insulating layer, a channel layer, an insulating layer, and a passivation layer sequentially formed on a surface of the substrate, wherein an oxide semiconductor layer forming a channel layer and a plurality of first in-plane switching (IPS) electrodes spaced apart from the oxide semiconductor layer are provided on the gate insulating layer; the insulating layer covers the oxide semiconductor layer and the plurality of first IPS electrodes; the passivation layer covers the channel layer and is formed with trenches, the trenches located on a side of each of the first IPS electrode and extending to the gate insulation layer; a plurality of second IPS electrodes are formed on the passivation layer and corresponding to the first IPS electrodes, the second IPS electrodes being connected to the first IPS electrodes; and the trenches of the array substrate are in communication with the space, and the liquid crystal is distributed in the space and the trenches.

* * * * *